(12) United States Patent
Broekaart et al.

(10) Patent No.: US 9,548,202 B2
(45) Date of Patent: Jan. 17, 2017

(54) METHOD FOR BONDING BY MEANS OF MOLECULAR ADHESION

(71) Applicant: Soitec, Crolles (FR)

(72) Inventors: Marcel Broekaart, Theys (FR); Arnaud Castex, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/434,624

(22) PCT Filed: Oct. 11, 2013

(86) PCT No.: PCT/IB2013/002280
§ 371 (c)(1),
(2) Date: Apr. 9, 2015

(87) PCT Pub. No.: WO2014/060817
PCT Pub. Date: Apr. 24, 2014

(65) Prior Publication Data
US 2015/0235851 A1    Aug. 20, 2015

(30) Foreign Application Priority Data
Oct. 18, 2012  (FR) ..................................... 12 59954

(51) Int. Cl.
*B32B 37/00*   (2006.01)
*H01L 21/18*   (2006.01)
*B32B 37/10*   (2006.01)

(52) U.S. Cl.
CPC ......... *H01L 21/187* (2013.01); *B32B 37/0007* (2013.01); *B32B 37/1009* (2013.01);
(Continued)

(58) Field of Classification Search
CPC ............... H01L 21/187; H01L 21/2007; H01L 21/67092; H01L 21/76251
(Continued)

(56) References Cited

U.S. PATENT DOCUMENTS

| 6,180,496 B1 * | 1/2001 | Farrens ................. H01L 21/187 |
| | | 257/E21.088 |
| 2003/0211704 A1 | 11/2003 | Shaheen et al. |
| 2005/0064680 A1 * | 3/2005 | Thallner ............. H01L 21/2007 |
| | | 438/455 |

FOREIGN PATENT DOCUMENTS

FR        2915624 A1     10/2008
FR    WO 2012010517 A1 *  1/2012  ....... H01L 21/67092
(Continued)

OTHER PUBLICATIONS

International Search Report for International Application No. PCT/IB2013/002280 dated Jan. 21, 2014, 2 pages.
(Continued)

*Primary Examiner* — John Goff
(74) *Attorney, Agent, or Firm* — TraskBritt

(57) ABSTRACT

The disclosure relates to a method of bonding by molecular adhesion comprising the positioning of a first wafer and of a second wafer within a hermetically sealed vessel, the evacuation of the vessel to a first pressure lower than or equal to 400 hPa, the adjustment of the pressure in the vessel to a second pressure higher than the first pressure by introduction of a dry gas, and bringing the first and second wafers into contact, followed by the initiation of the propagation of a bonding wave between the two wafers, while maintaining the vessel at the second pressure.

20 Claims, 4 Drawing Sheets

(52) U.S. Cl.
CPC ... *B32B 2037/0092* (2013.01); *B32B 2307/20* (2013.01); *B32B 2457/14* (2013.01)

(58) Field of Classification Search
USPC .................................................. 438/455, 459
See application file for complete search history.

(56) References Cited

FOREIGN PATENT DOCUMENTS

| JP | 01272766 A | 10/1989 | | |
|---|---|---|---|---|
| JP | WO 2010098234 A1 | * | 9/2010 | ............. B23K 20/02 |

OTHER PUBLICATIONS

Written Opinion of the International Searching Authority for International Application No. PCT/IB2013/002280 dated Jan. 21, 2014, 5 pages.

* cited by examiner

METHOD FOR BONDING BY MEANS OF MOLECULAR ADHESION

CROSS-REFERENCE TO RELATED APPLICATIONS

This application is a national phase entry under 35 U.S.C. §371 of International Patent Application PCT/IB2013/002280, filed Oct. 11, 2013, designating the United States of America and published in English as International Patent Publication WO 2014/060817 A1 on Apr. 24, 2014, which claims the benefit under Article 8 of the Patent Cooperation Treaty and under 35 U.S.C. §119(e) to French Patent Application Serial No. 1259954, filed Oct. 18, 2012, the disclosure of each of which is hereby incorporated herein in its entirety by this reference.

TECHNICAL FIELD

The present disclosure relates to the field of fabrication of multilayer semiconductor structures or wafers (also referred to as composite structures) formed by transfer of at least one layer onto a final substrate.

BACKGROUND

Multilayer semiconductor structures or wafers are formed by transfer of at least one layer onto a final substrate. Such a layer transfer is obtained by bonding, for example, by molecular adhesion, of a first wafer (or initial substrate) onto a second wafer (or final substrate), the first wafer generally being thinned after bonding. The transferred layer may furthermore comprise all or part of a component or of a plurality of micro-components.

More precisely, this disclosure relates to the problem of the bonding defects that may occur in a localized manner at the bonding interface between two wafers bonded by molecular adhesion.

Bonding by molecular adhesion is a technique well known per se. As a reminder, the principle of bonding by molecular adhesion is based on bringing two surfaces into direct contact, in other words, without the use of a specific material (glue, wax, brazing, etc.). Such an operation requires the bonding surfaces to be sufficiently smooth, free from particulates or from contamination, and that they are sufficiently close together to allow a contact to be initiated, typically at a distance of less than a few nanometers. In this case, the forces of attraction between the two surfaces are sufficiently high to cause molecular adhesion (bonding induced by all the electronic interaction forces of attraction (van der Waals forces) between atoms or molecules of the two surfaces to be bonded).

FIGS. 1A to 1D show one exemplary embodiment of a multilayer structure comprising bonding by molecular adhesion of a first wafer 102 onto a second wafer 106, the latter forming a support wafer.

The first wafer 102 here comprises a series of micro-components 104 on its bonding face 102a (FIG. 1A). The micro-components 104 are formed by photolithography by means of a mask allowing areas for formation of patterns to be defined that correspond to the micro-components 104 to be formed.

In this document, the term "micro-components" is understood to mean the devices or any other patterns resulting from the technological steps carried out on or within the layers and whose positioning must be controlled with precision. These can, therefore, be active or passive components, simple contacts, interconnections, etc.

In this example, the support wafer 106 is covered by a layer of thermal oxide 108 (or deposited oxide) formed, for example, by oxidation of the support wafer 106 in order to facilitate the molecular adhesion with the first wafer 102 (FIG. 1A).

Some form of treatment is generally implemented in order to prepare the bonding surface 102a of the first wafer 102 and the bonding surface 106a of the second wafer 106, this treatment varying according to the bonding energy that it is desired to obtain (chemical-mechanical polishing (CMP), cleaning, brushing, hydrophobic/hydrophilic treatment, etc.).

Once the wafers 102 and 106 have been prepared, the support wafer 106 is positioned in a bonding machine 115. More precisely, the support wafer 106 is positioned on a substrate holder 110 of the bonding machine 115 with a view to its assembly by molecular adhesion with the first wafer 102. The substrate holder 110 holds the second wafer 106 in position by means, for example, of an electrostatic or suction system.

The first wafer 102 is subsequently placed onto the second wafer 106 so as to be in intimate contact with the latter (FIG. 1B). The initiation of the molecular adhesion is then carried out by application of a contact force (mechanical pressure) on the first wafer 102 (FIG. 1C). The application of this contact force allows the propagation of a bonding wave 122 to be initiated starting from this point of initiation (FIG. 1D). The bonding wave 122 is initiated by means of an application tool 114 (a TEFLON® stylus, for example) with which the bonding machine 115 is equipped.

In this document, "bonding wave" refers to the molecular bonding or adhesion wavefront that propagates from the point of initiation and corresponds to the diffusion of the attractive forces (van der Waals forces) from the point of contact over the whole intimate contact surface (bonding interface) between the two wafers.

The propagation of the bonding wave 122 over the entirety of the bonding surfaces of the wafers 102 and 106 thus allows the bonding by molecular adhesion of the two wafers, so as to obtain a multilayer structure 112.

Once the bonding has been effected, the bonding may be reinforced by implementing a thermal annealing. The first wafer 102 may subsequently be thinned in order to form a layer transferred onto the support wafer 106.

The applicant has, however, observed the presence of localized bonding defects 118 at the bonding interface between the two wafers 102 and 106, and more precisely in a region 120 situated at the opposite side from the bonding initiation point 116 (FIG. 1E). These defects correspond to regions in which the two wafers 102 and 106 exhibit a very low bonding force, or even a total absence of bonding.

These bonding defects are undesirable for the manufacturer since they reduce the quality of the bonding between the wafers. More generally, these defects are an indication of a non-optimized fabrication process, a fact that reduces the attractiveness of the multilayer structures thus produced.

It is currently, therefore, necessary to improve the quality of fabrication of the multilayer structures assembled by molecular adhesion. In particular, there exists a need for a bonding process using molecular adhesion allowing the appearance of the aforementioned bonding defects at the bonding interface between the wafers to be reduced, or even completely prevented.

BRIEF SUMMARY

For this purpose, this disclosure provides a method of bonding by molecular adhesion, comprising:

the positioning of a first wafer and of a second wafer within a hermetically sealed vessel;

the evacuation of the vessel to a first pressure lower than or equal to 400 hPa;

the adjustment of the pressure in the vessel to a second pressure higher than the first pressure by introduction of a dry gas having a water concentration of less than 10,000 ppm; and bringing the first and second wafers into contact followed by the initiation of the propagation of a bonding wave between the two wafers while maintaining the vessel at the second pressure (P2).

The method of the disclosure advantageously allows, prior to bonding, the elimination of the water present at the surface of the wafers (by desorption) and a large part of the saturated water present in gaseous form within the atmosphere of the vessel to be evacuated. In this way, the quantity of water trapped at the bonding interface (after bonding) is significantly reduced, a fact that allows the appearance of the aforementioned bonding defects at the bonding interface between the wafers to be reduced, or even completely prevented.

Furthermore, such concentrations of water lower than 1000 ppm advantageously allow the concentration of saturated water present in gaseous form within the atmosphere of the vessel during the bonding by molecular adhesion to be limited.

Furthermore, the dry gas can be at least one from the following: nitrogen, helium, air, argon and neon.

According to one embodiment of the disclosure, the second pressure is at least 1 atm.

According to another embodiment, at least one of the wafers comprises at least one cavity on its bonding surface. In addition, the second pressure is fixed in such a manner so as to adjust the pressure in the cavities after bonding to the second pressure.

In one particular embodiment, the wafers are silicon wafers.

BRIEF DESCRIPTION OF THE DRAWINGS

Other features and advantages of this disclosure will become apparent from the description presented hereinbelow, with reference to the accompanying drawings that illustrate one exemplary embodiment of it, which is not in any way limiting. In the figures.

DETAILED DESCRIPTION

This disclosure relates, generally speaking, to a method of bonding by molecular adhesion allowing the appearance of undesirable bonding defects at the bonding interface to be reduced or prevented.

As previously indicated, the applicant has observed localized bonding defects appearing at the bonding interface of a multilayer structure formed by molecular adhesion bonding of a first wafer onto a second wafer.

The flat elements composing a multilayer structure generally take the form of wafers with a generally circular contour and can have various diameters, notably diameters of 100 mm (millimeters), 200 mm or 300 mm. However, these may also be flat elements of any given shape, such as a rectangular-shaped flat element, for example.

Figure 1A:
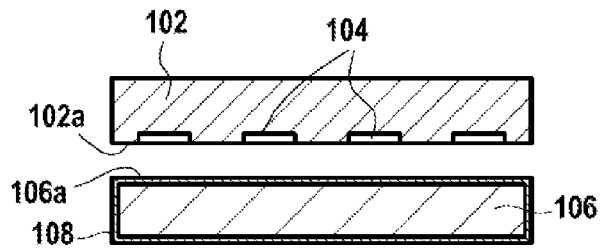
FIGS. 1A to 1D show, schematically, one example of a method of bonding by molecular adhesion known to those skilled in the art.
Figure 1B:
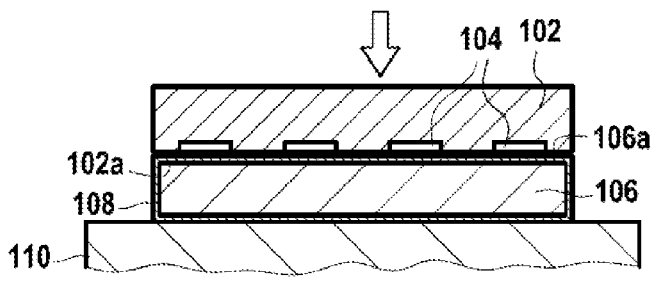
Figure 1C:
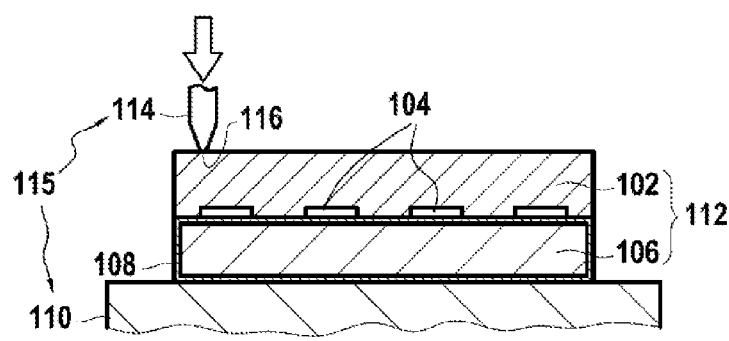
Figure 1D:
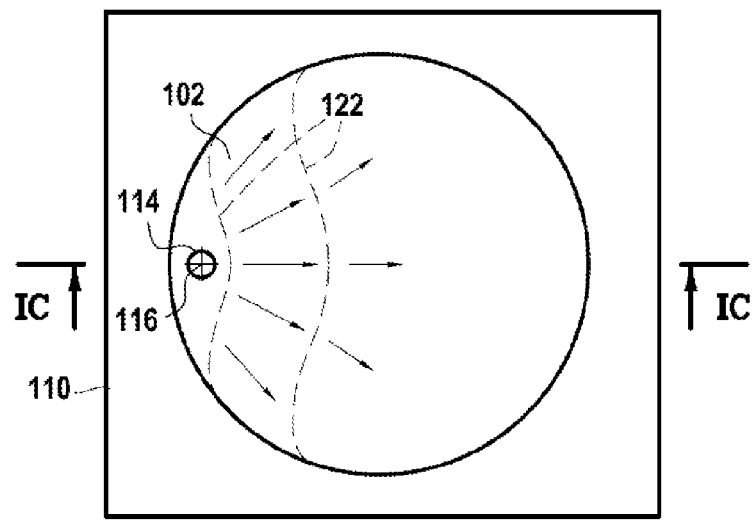
Figure 1E:
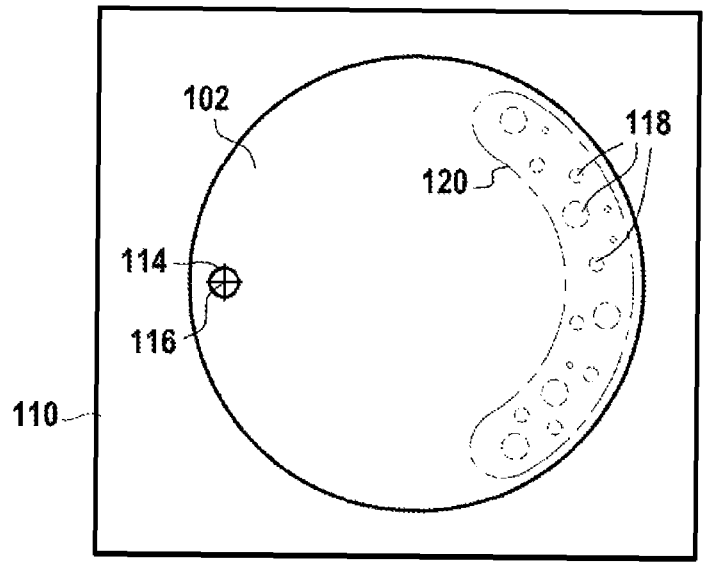
FIG. 1E shows, schematically, bonding defects appearing during the bonding method illustrated in FIGS. 1A to 1D.

A more detailed study of the bonding defects 118, illustrated in FIG. 1E, has allowed the mechanism for formation of these defects to be highlighted and a method to be established that prevents their formation.

The mechanism responsible for the formation of the defects 118 is now described with reference to FIGS. 1A to 1F.

As previously explained, the initiation of the bonding by molecular adhesion is typically carried out by the application of a contact force at a point of initiation 116 situated near the edge of the first wafer 102 (FIG. 1C). The application of this contact force allows the propagation of a bonding wave 122 to be initiated starting from the point of initiation 116 (FIG. 1D).

As the bonding wave 122 is propagated, the bonding wave 122 repels toward the outside the ambient air present between the two wafers 102 and 106 and the excess molecules of water adsorbed at the surface of the wafers. The air that is thus repelled between the two wafers 102 and 106 contains a certain concentration of water in gaseous form.

An abrupt drop in pressure occurs between the wafers 102 and 106 when the bonding wave 122 reaches the neighborhood of the edges of the wafer, on the opposite side from the point of initiation 116. This abrupt fall in pressure leads to a corresponding fall in temperature (case of an adiabatic process), which causes the condensation on the bonding surfaces 102a and 106a of the saturated water present in the air evacuated by the bonding wave 122. This condensation takes place mainly in the region 120 on the opposite side to the point of initiation 116.

Figure 1F:
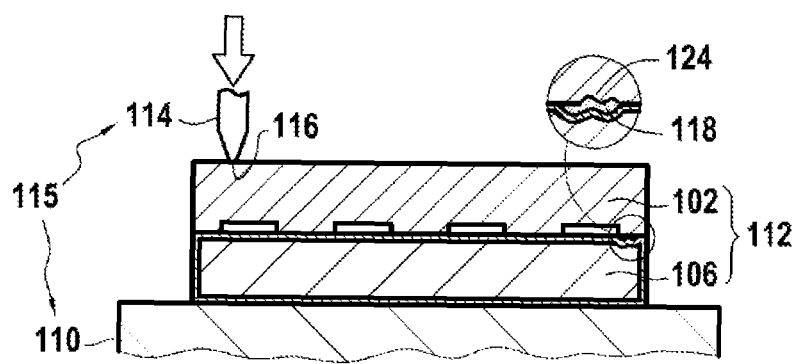
FIG. 1F illustrates, schematically, the mechanism of formation of the bonding defects shown in FIG. 1E.

It will be noted that this condensation occurs, in particular, on surface irregularities 124 (surface topology or nanotopology, fine particles, micro scratches, etc.) that can be present on the bonding surface of each of the wafers 102 and 106 (FIG. 1F).

Once the bonding has been carried out, an excess of molecules of water is then trapped in the form of condensation in the region 120 situated at the bonding interface of the multilayer structure 112.

The water that condenses on the surface irregularities 124 deteriorates the quality of the bonding of the two wafers 102 and 106 by molecular adhesion. During the later annealing of the multilayer structure 112 (or any other thermal treatment at a temperature higher than 100° C.), the molecules of water return to the gaseous state, which leads to the appearance of bonding defects 118 known as "edge voids" (or "bonding voids") at the bonding interface of the multilayer structure 112. These bonding defects 118 take the form of air bubbles of variable size (generally between 50 μm and 500 μm) localized essentially at the wafer edge.

As has already been indicated, these bonding defects 118 are undesirable and may, in particular, cause the unintentional detachment of portions of the wafer 102 near the bonding defects 118 when the wafer 102 undergoes a thinning step (by grinding and/or chemical etching, for example).

For this purpose, the disclosure provides a method of bonding by molecular adhesion involving the control of the pressure applied to the wafers prior to bonding in order to solve this problem of bonding defects.

One particular embodiment of the bonding method according to the disclosure is now described with reference to FIGS. 2A to 2D.

Figure 2A:
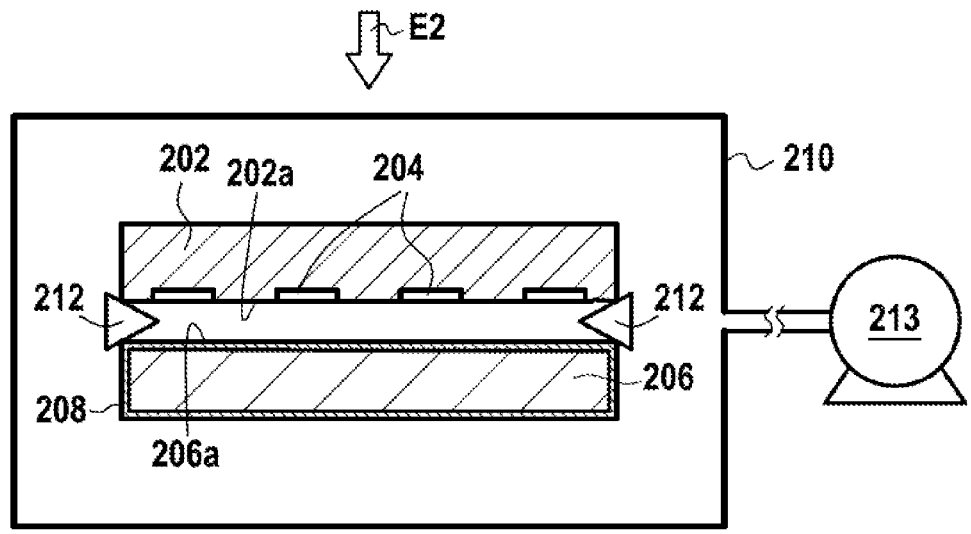
FIGS. 2A to 2D show, schematically, the method of bonding by molecular adhesion according to one particular embodiment of the disclosure.
Figure 2B:
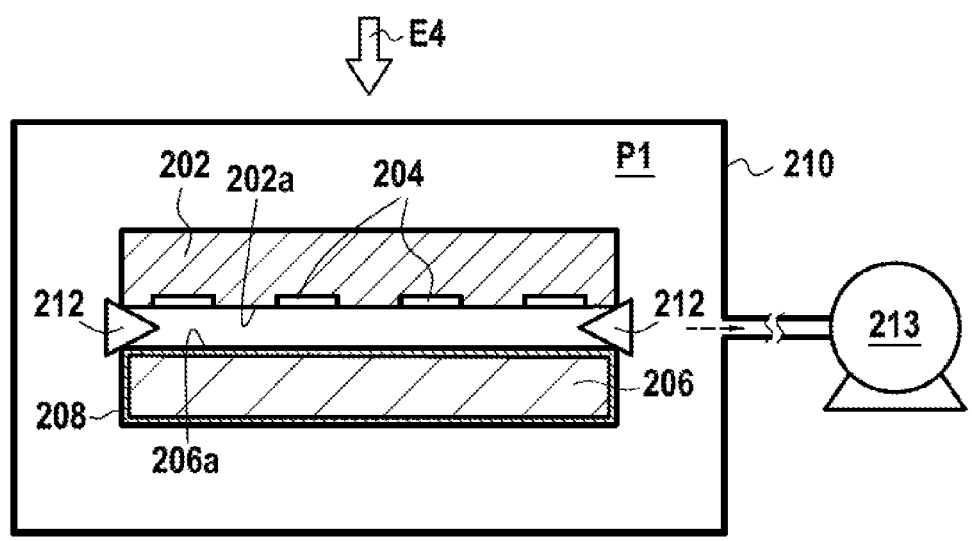
Figure 2C:
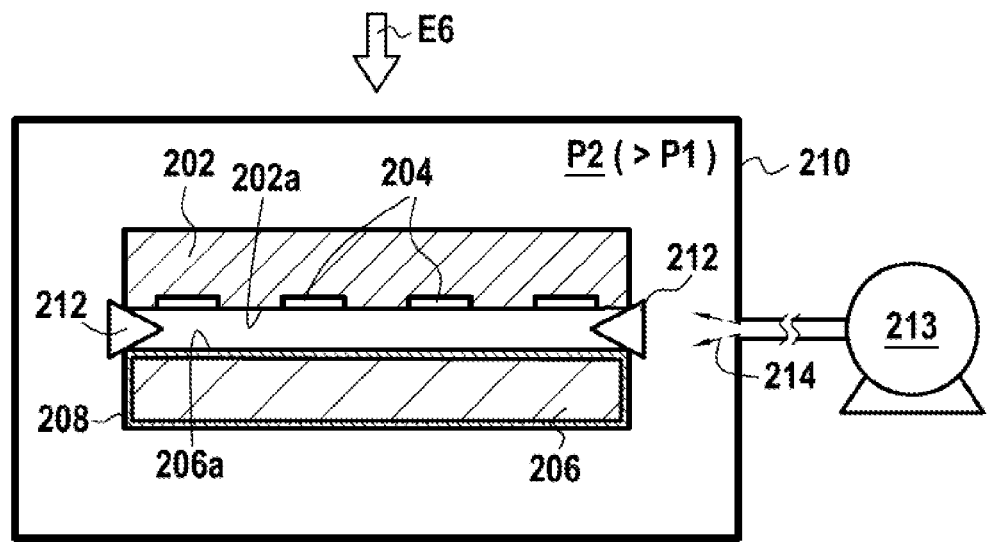

The aim of this method is to bond, by molecular adhesion, a first wafer 202 onto a second wafer 206, the second wafer 206 constituting a support wafer (FIG. 2A). The wafers are 202 and 206 are, respectively, identical to the wafers 102 and 106 depicted in FIG. 1A.

More precisely, the first wafer 202, in this example, comprises micro-components 204 on its bonding surface 202a. Furthermore, an oxidation is carried out on the second wafer 206 so as to form a layer of thermal oxide 208 over its entire surface. It should be noted that it is possible to only deposit a layer of oxide on the bonding surface 206a of the second wafer 206. Alternatively, a layer of oxide may be formed on the bonding surface 202a of the first wafer 202.

It is furthermore pointed out that the first and second wafers 202 and 206 here have the same diameter. They could, however, have different diameters, or have a non-circular shape. Moreover, the method of the disclosure may also be applied when at least one of the two wafers to be bonded is a "virgin" wafer with no micro-components and/or comprises cavities (or channels) on its bonding surface.

Furthermore, the wafers 202 and 206 may have surface irregularities (not shown) analogous to the surface irregularities 124 illustrated in FIG. 1F.

During step E2, the first and second wafers 202 and 206 are, first of all, positioned within a hermetically sealed vessel 210. In this example, the first wafer 202 is placed on top of the second wafer 206, spacers 212 being placed around the edges of the wafers between the wafers 202 and 206 in order to maintain a separation between wafers 202 and 206.

It should be noted that the ambient atmosphere present at this stage within the vessel 210 can have a greater or smaller concentration of water $C_{water}$ in gaseous form depending on the circumstances. Moreover, the pressure in the vessel 210 at this stage is not defined (it could be 1 atm, for example).

The vessel 210 is subsequently evacuated to a first pressure P1 lower than or equal to the threshold pressure of 400 hPa (i.e., 40,000 Pa equivalent to 400 mbars) (step E4). For this purpose, a vacuum pump 213 suitable for this purpose is used, for example. The vacuum thus established in the vessel 210 may be a higher or lower vacuum (e.g., P1=1 hPa, 100 hPa, 400 hPa, etc.) but, in any case, it is imperative that P1<400 hPa in such a manner so as to lead to the desorption of the molecules of water present in the form of condensation on the bonding surfaces 202a and 206a of the wafers 202 and 206, respectively.

The step E4, therefore, has the effect of reducing the quantity of water present on the surface of the wafers 202 and 206 to be bonded. It is indeed this water that, when it is in excess on the surface of the wafers, is responsible for the bonding defects of the "edge void" type during the molecular adhesion bonding process. However, the presence of a minimum amount of water on the bonding surfaces 202a and 206a is necessary in order for it to subsequently be possible to bond the wafers 202 and 206 (hydrophilic bonding) by molecular adhesion. The step E4, therefore, allows the quantity of water present (adsorbed) on the surface of the wafers to be controlled in such a manner so as to enable a subsequent hydrophilic bonding while at the same time limiting the appearance of bonding defects.

The evacuation to the pressure P1 (E4) also allows the concentration $C_{water}$ of saturated water present in the atmosphere of the vessel 210 to be significantly reduced.

The step E4 is carried out over a given period of time, which may be a few seconds or more (2 or 3 minutes, for example). This time is preferably chosen in such a manner as to optimize the desorption of the water on the bonding surfaces 202a and 206a, so as to obtain a concentration of water lower than 10,000 ppm and, preferably, lower than 1000 ppm, while at the same time allowing the bonding by molecular adhesion to occur. In the case where the two wafers 202 and 206 are made of Si (silicon), a pressure P1 of 5 hPa may, for example, be established at a constant level for 2 minutes (min).

Once the pressure P1 has been established, the pressure in the vessel 210 is adjusted (E6) to a second pressure P2 higher than or equal to the first pressure P1 by introduction of a dry gas 214 into the vessel.

The dry gas 214 introduced into the vessel 210 at the step E6 preferably has a concentration of water lower than 10,000 ppm, or even lower than 1000 ppm. In this way, the quantity of water that is re-introduced into the atmosphere of the vessel 210 during the step E6 is limited.

The second pressure P2 can, for example, correspond to standard atmospheric pressure (i.e., P2=1 atm) or to a pressure lower than standard atmospheric pressure in the case notably where at least one of the wafers 202 and 206 has cavities on its bonding surface.

After the step E6, the wafers 202 and 206 are brought into contact (E8). In the present case, this contact is made by removing the spacers 212 that were holding the first wafer 202 at a certain separation above the second wafer 206.

A bonding wave is subsequently initiated (E10) between the wafers 202 and 206 in order to bond the latter by molecular adhesion.

The steps E8 and E10 here are carried out while at the same time maintaining the vessel 210 at the second pressure P2.

Figure 2D:
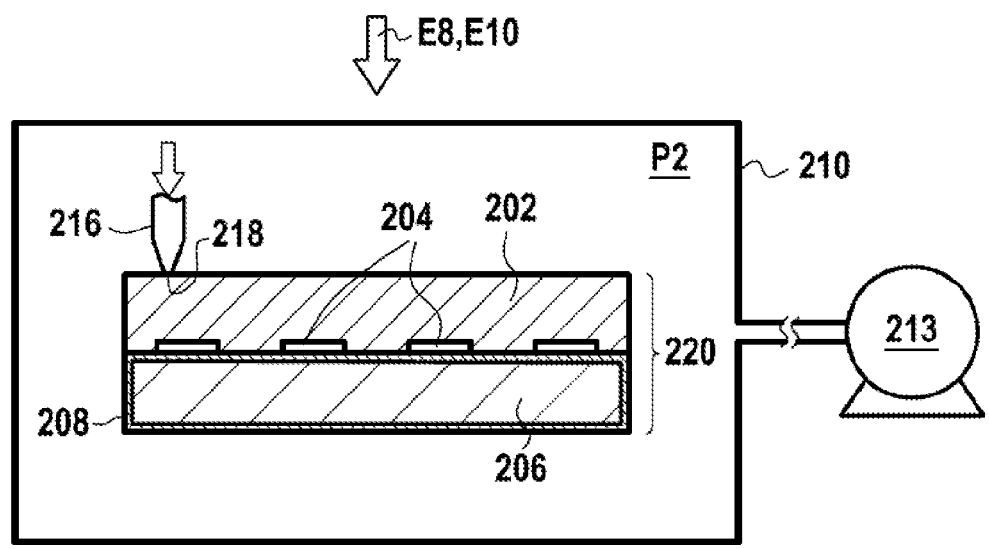

In this example, the initiation E10 of the bonding wave is established by the application, using an application tool 216 (a stylus made of TEFLON®, for example), of a contact force at the point of initiation 218 situated near to an edge of the wafer 202 (FIG. 2D). The application of this contact force allows the propagation of a bonding wave to be triggered starting from the point of initiation 218.

Choosing P2=1 atm advantageously allows the generation of spurious bonding waves to be avoided during the bonding E10 of the two wafers.

It will, however, be noted that other operating modes allow the propagation of a bonding wave to be initiated. Under certain pressure conditions (P2<1 atm), it is, in particular, possible to trigger the initiation of such a wave propagation without applying mechanical pressure onto the first wafer 202.

For some applications and, in particular, when the wafers to be bonded exhibit significant deformations, it can be advantageous to fix P2 at a value higher than 1 atm (2 atm, for example). It is thus possible to even further limit the generation of spurious bonding waves during the bonding E10.

Once the wafers 202 and 206 have been bonded, the whole assembly 220 may be subjected to an annealing for bonding reinforcement carried out at a temperature along the order of 1100° C., for example.

The first wafer 202 can subsequently be thinned by grinding (or any other suitable technique) in order to form a layer transferred onto the second wafer 206 starting from the initial first wafer 202.

The invention claimed is:

1. A method of bonding by molecular adhesion, comprising:
    positioning a first wafer and a second wafer within a hermetically sealed vessel in an environment comprising a concentration of water in gaseous form;
    adsorbing water molecules on surfaces of the first wafer and the second wafer;
    evacuation of the vessel to a first pressure between 1 hPa and 400 hPa and desorbing some of the water molecules present in the form of condensation on the surfaces of the first wafer and the second wafer, and optimizing the desorption so as to obtain a concentration of water in the environment lower than 10,000 ppm while allowing for subsequent bonding of the surfaces of the first wafer and the second wafer by hydrophilic molecular adhesion;
    adjustment of the pressure in the vessel to a second pressure higher than the first pressure by introduction of a dry gas, the dry gas having a concentration of water lower than 10,000 ppm; and
    bringing the first and second wafers into contact while a residual amount of water molecules remain present on the surfaces of the first wafer and the second wafer, followed by the initiation of the propagation of a bonding wave between the two wafers resulting in the hydrophilic molecular adhesion between the first wafer and the second wafer, while maintaining the vessel at the second pressure.

2. The method according to claim 1, wherein the dry gas has a concentration of water lower than 1,000 ppm.

3. The method according to claim 2, wherein the dry gas comprises one or more gases selected from the group consisting of nitrogen, helium, air, argon and neon.

4. The method according to claim 3, wherein the second pressure is at least 1 atm.

5. The method according to claim 4, wherein at least one of the first and second wafers comprises at least one cavity on a bonding surface thereof, and wherein the second pressure is fixed in such a manner so as to adjust a pressure in the at least one cavity after bonding to the second pressure.

6. The method according to claim 5, wherein the first and second wafers are silicon wafers.

7. The method according to claim 1, wherein the dry gas comprises one or more gases selected from the group consisting of nitrogen, helium, air, argon and neon.

8. The method according to claim 7, wherein the second pressure is at least 1 atm.

9. The method according to claim 1, wherein the second pressure is at least 1 atm.

10. The method according to claim 1, wherein at least one of the first and second wafers comprises at least one cavity on a bonding surface thereof, and wherein the second pressure is fixed in such a manner so as to adjust a pressure in the at least one cavity after bonding to the second pressure.

11. The method according to claim 1, wherein the first and second wafers are silicon wafers.

12. A method of molecularly bonding a first wafer to a second wafer, comprising:
    positioning the first wafer and the second wafer within a hermetically sealed vessel in an environment comprising a concentration of water in gaseous form;
    adsorbing water molecules on surfaces of the first wafer and the second wafer;
    reducing a pressure within the hermetically sealed vessel to between 1 hPa and 400 hPa and desorbing some of the water molecules present in the form of condensation on the surfaces of the first wafer and the second wafer, and optimizing the desorption so as to obtain a concentration of water in the environment lower than 10,000 ppm while allowing for subsequent bonding of the surfaces of the first wafer and the second wafer by hydrophilic molecular adhesion;
    introducing a gas into the vessel so as to raise the pressure within the hermetically sealed vessel to a bonding pressure, the gas having a concentration of water of 10,000 ppm or less; and
    molecularly bonding the first wafer to the second wafer by hydrophilic molecular adhesion while a residual amount of water molecules remain present on the surfaces of the first wafer and the second wafer and while maintaining the pressure in the hermetically sealed vessel at the bonding pressure.

13. The method according to claim 12, wherein a concentration of water in the gas is 1,000 ppm or lower.

14. The method according to claim 13, wherein the gas comprises one or more gases selected from the group consisting of nitrogen, helium, air, argon and neon.

15. The method according to claim 14, wherein the bonding pressure is at least 1 atm.

16. The method according to claim 15, wherein at least one of the first wafer and the second wafer comprises at least one cavity on a bonding surface thereof, and wherein the bonding pressure is fixed in such a manner so as to adjust a pressure in the at least one cavity after molecularly bonding the first wafer to the second wafer.

17. The method according to claim 16, wherein each of the first wafer and the second wafer comprises a silicon wafer.

18. The method according to claim 12, wherein the bonding pressure is at least 1 atm.

19. The method according to claim 12, wherein at least one of the first wafer and the second wafer comprises at least one cavity on a bonding surface thereof, and wherein the bonding pressure is fixed in such a manner so as to adjust a pressure in the at least one cavity after molecularly bonding the first wafer to the second wafer.

20. The method according to claim 12, wherein the first and second wafers are silicon wafers.

* * * * *